(12) United States Patent
Lou

(10) Patent No.: US 6,211,569 B1
(45) Date of Patent: Apr. 3, 2001

(54) INTERCONNECTION LINES FOR IMPROVING THERMAL CONDUCTIVITY IN INTEGRATED CIRCUITS AND METHOD FOR FABRICATING THE SAME

(75) Inventor: Chine-Gie Lou, Hsinchu Hsien (TW)

(73) Assignee: Worldwide Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/400,626

(22) Filed: Sep. 20, 1999

(30) Foreign Application Priority Data

Jul. 9, 1999 (TW) ................................. 88111733

(51) Int. Cl.[7] ........................... H01L 23/48; H01L 23/52; H01L 29/40
(52) U.S. Cl. ........................... 257/758; 257/759; 257/760
(58) Field of Search ..................... 257/758–760, 257/640, 649

(56) References Cited

U.S. PATENT DOCUMENTS 6,144,099 * 11/2000 Lopatin et al. ...................... 257/758

* cited by examiner

Primary Examiner—Sara Crane
Assistant Examiner—Thien F. Tran
(74) Attorney, Agent, or Firm—Baker Botts L.L.P.

(57) ABSTRACT

The present invention discloses a structure of metal interconnection lines in integrated circuits for improving thermal conductivity therein. In the structure, a silicon nitride layer is formed underneath a first metal pattern of integrated circuits. Moreover, a silicon nitride plug is formed between two adjacent metal patterns and it serves as a thermal conductor. At least one metal plug in dielectric layers between the metal patterns is an electrical connection of integrated circuits. The present invention also discloses a method for fabricating the structure as mentioned above.

10 Claims, 3 Drawing Sheets

INTERCONNECTION LINES FOR IMPROVING THERMAL CONDUCTIVITY IN INTEGRATED CIRCUITS AND METHOD FOR FABRICATING THE SAME

FIELD OF THE INVENTION

The present invention relates to a structure of interconnection lines in integrated circuits and a method to fabricate the same, more specifically, to a structure of interconnection lines in integrated circuits for improving the thermal conductivity of metal lines therein and a method for fabricating the same.

BACKGROUND OF THE INVENTION

The fabricating of ultra-large-scale integrated (ULSI) circuits has a trend of shrinking the size of the circuits. The semiconductor devices that are fabricated on semiconductor substrates have more small size, the cost for manufacturing the devices is more lower. Thus, how to shrink the size of integrated circuits has become an important issue in the semiconductor process.

As the linewidth of integrated circuits is smaller than one-half micron meters or even smaller than one-quarter micron meters, the thermal conductivity of the intermetal dielectric layers in integrated circuits must be good enough for the reliability of the integrated circuits.

For the high-speed operation of the semiconductor devices on semiconductor substrate, the resistance-capacitance (RC) time delay value of the device must be small enough. Thus, a low dielectric-constant (k) material is preferred for interlayer dielectric layers or intermetal dielectric layers of integrated circuits to reduce the capacitance value of the integrated circuits for high-speed operation. Nevertheless, the low-k dielectric material is organic material and it has a poor thermal conductive ability for integrated circuits.

As the operation speed of integrated circuits is increased, the metal interconnection lines is heated. Thus, high-speed integrated circuits need good thermal-conductivity dielectric material as interlayer dielectric layers or intermetal dielectric layers of the integrated circuits for normal operation.

Referring to FIG. 1, it demonstrates a cross-section view of an integrated circuit formed on a substrate. A first metal pattern 130 is formed on an interlayer dielectric layer 110 and it communicates with the integrated circuit by metal plug 120. Besides, a barrier layer 115 is formed between the metal plug 120 and the interlayer dielectric layer 110 for adhesion and forming an ohmic contact. Moreover, a second metal pattern 180 is formed on a cap layer 160 on an intermetal dielectric layer 150 and it connects to the first metal pattern 130 by using metal plugs 170 in the intermetal dielectric layer 150. Furthermore, a barrier layer 165 is formed underneath the metal plugs 170 for adhesion.

The metal interconnection structure, which is shown in FIG. 1, is a conventional structure used in ULSI circuits. The thermal dissipation of the metal interconnection lines in the integrated circuits is implemented by dielectric layers between the metal interconnection lines and heat is conducted from a top metal pattern of the circuit to a first metal pattern 130, finally, to the substrate 100. If the dielectric layer in integrated circuits has no good thermal conductive ability, the thermal dissipation of the integrated circuits will be hardly reached.

According to the above discussion, normal organic low dielectric-constant material can not provide good thermal conductivity for integrated circuits. It is needed a metal interconnection structure of integrated circuits in order to enhance the thermal dissipation of integrated circuits during the normal operation of the circuits.

SUMMARY OF THE INVENTION

A structure of metal interconnection lines in integrated circuits for improving thermal conductivity of the metal interconnection lines, comprising: a substrate, wherein the integrated circuits formed on the substrate; an interlayer dielectric layer formed on the substrate; a silicon nitride layer formed on the interlayer dielectric layer; at least one first metal plug formed in the interlayer dielectric layer and the silicon nitride layer; a first metal pattern formed on the silicon nitride layer and communicated with the integrated circuits by the at least one first metal plug; a liner oxide layer formed on the first metal pattern and on the silicon nitride layer; an intermetal dielectric layer formed on the liner oxide layer; at least one second metal plug formed in the intermetal dielectric layer and the liner oxide layer; at least one silicon nitride plug formed in the intermetal dielectric layer and the liner oxide layer; a second metal pattern formed on the intermetal dielectric layer, the at least one silicon nitride plug and the at least one second metal plug, the second metal pattern communicated with the first metal pattern by the at least one second metal plug, wherein the at least one silicon nitride plug being adapted for improving thermal conductivity.

A structure of metal interconnection lines in integrated circuits for improving thermal conductivity of the metal interconnection lines, comprising: a substrate, wherein the integrated circuits formed on the substrate; a plurality of metal patterns formed on the substrate for interconnection lines of the integrated circuits, wherein the metal patterns isolated from each other by dielectric layers for insulating; at least one metal plug formed in one of the dielectric layers between one of the metal patterns and other of the metal patterns formed thereon, wherein the plurality of metal patterns communicating to each other and to the integrated circuits on the substrate by the at least one metal plug therebetween; at least one silicon nitride plug formed between one of the metal patterns and other of the metal patterns formed thereon, wherein the at least one silicon nitride plug adapted for improving thermal conductivity of the plurality of metal patterns.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a structure of metal interconnection lines for improving the thermal conductivity of the metal interconnection lines in integrated circuits and a method for fabricating the structure.

Figure 7:
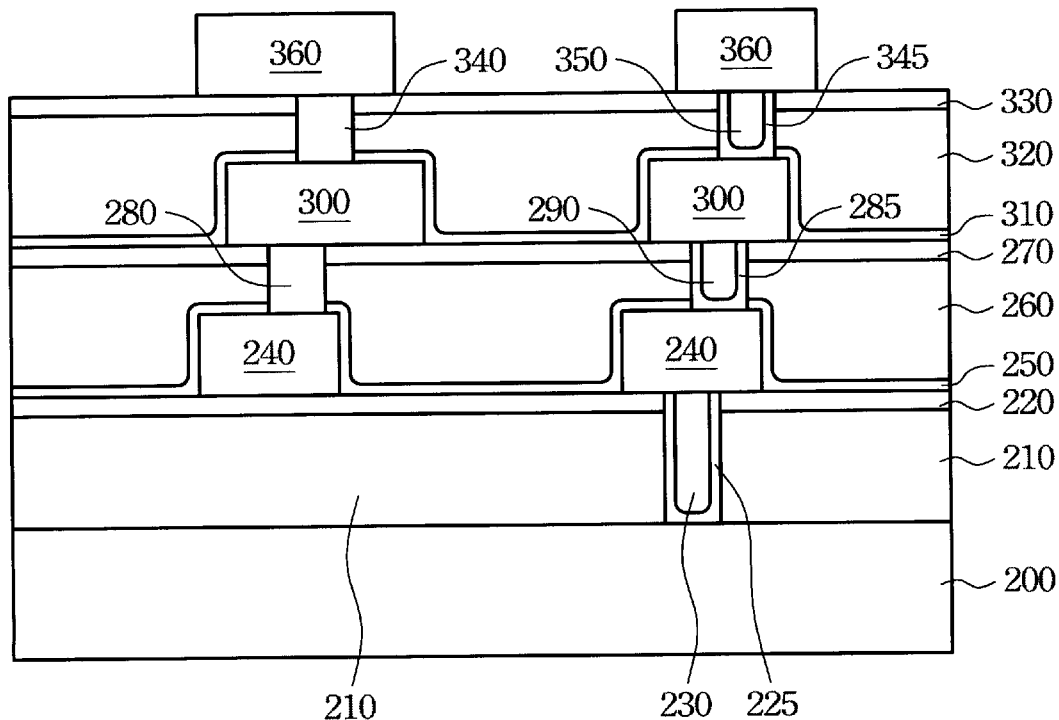
FIG. 7 shows a cross-section view of a substrate in accordance with the present invention, a first metal pattern, a second metal pattern and a third metal pattern are sequentially defined on the substrate and these metal patterns are communicated by using several tungsten plugs and several silicon nitride plugs formed in a interlayer dielectric layer and intermetal dielectric layers.

Referring to FIG. 7, it demonstrates a structure of metal interconnection lines in integrated circuits for improving thermal conductivity of the metal interconnection lines. A substrate is provided and integrated circuits are formed on the substrate. A plurality of metal patterns are formed on the substrate for interconnection lines of the integrated circuits and the metal patterns are isolated from each other and from the substrate by dielectric layers for insulating. At least one metal plug is formed in one of the dielectric layers between one of the metal patterns and other of the metal patterns which are formed thereon. Furthermore, the plurality of metal patterns communicates to each other and to the integrated circuits on the substrate by the at least one metal plug therebetween. At least one silicon nitride plug is formed between one of the metal patterns and other of the metal patterns formed thereon, wherein the at least one silicon nitride plug is adapted for improving thermal conductivity of the plurality of metal patterns.

Figure 1:
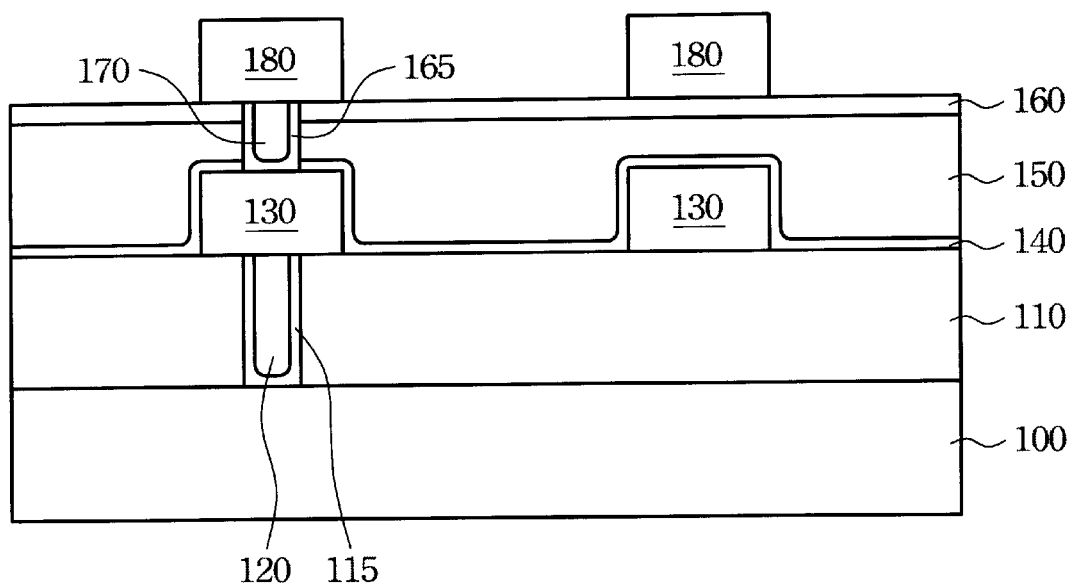
FIG. 1 shows a cross-section view of a substrate in accordance with prior art, a first metal pattern is formed on integrated circuits and a second metal pattern is formed on the first metal pattern, the second metal pattern communicates with the first metal pattern by using the tungsten plug therebetween.
Figure 2:
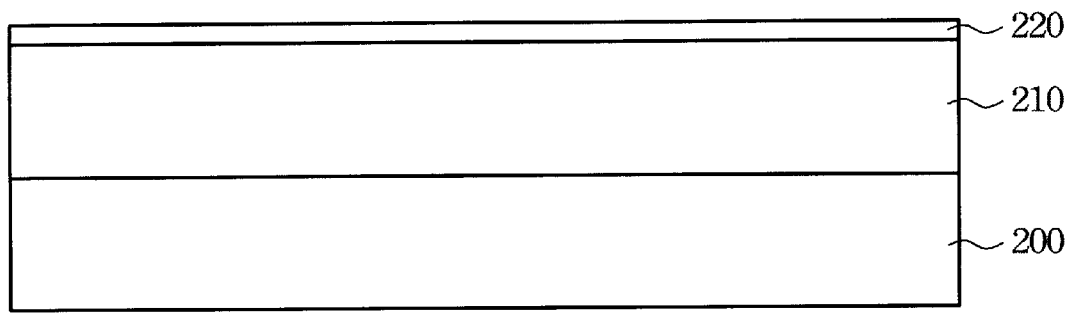
FIG. 2 shows a cross-section view of a substrate in accordance with the present invention, integrated circuits are fabricated on the substrate and an interlayer dielectric layer is formed on the integrated circuits.

Referring to FIG. 2, a semiconductor substrate 200 is provided for the base of integrated circuits formed thereon and an interlayer dielectric layer 210 is formed on the substrate 200. After the interlayer dielectric layer 210 is deposited, the layer 210 is polished by using chemical mechanical polishing (CMP) process for global polarization. Furthermore, a silicon nitride layer 220 is formed on the interlayer dielectric layer 210.

Figure 3:
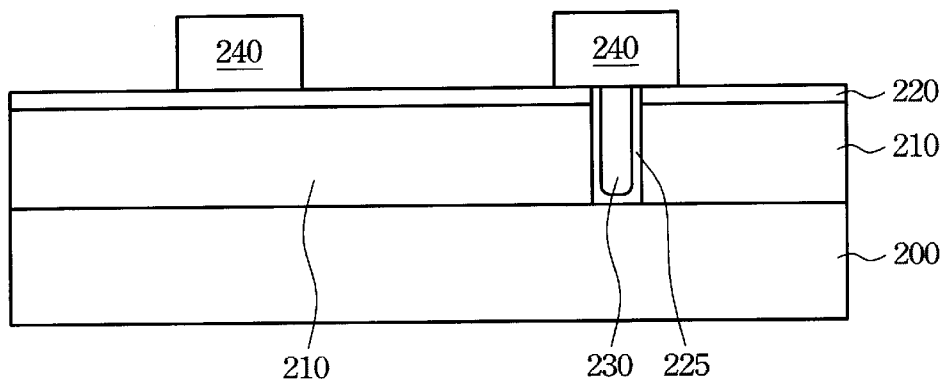
FIG. 3 shows a cross-section view of a substrate in accordance with the present invention, a first metal pattern is defined on the interlayer dielectric layer and it contacts to integrated circuits formed on the substrate with the metal plug.

Referring to FIG. 3, the interlayer dielectric layer 210 and the silicon nitride layer 220 are etched by using lithography process and anisotropically etching process to form a contact hole therein and the contact holes exposes the surface of the substrate 200 for metal interconnections of the integrated circuits thereon. A barrier layer 225 is formed on the sidewall and the bottom of the contact hole for the adhesion of a metal plug formed therein to the interlayer dielectric layer 210. Afterward, a metal tungsten is deposited to refill into the contact hole and then is etched to form a metal plug 230 in the contact hole.

Referring to FIG. 3, a first metal pattern 240 is defined on the silicon nitride layer 220 and communicates with the integrated circuits on the substrate 200 by the metal plug 230. According to the above description, the present invention adapts the silicon nitride layer 220 underneath the first metal pattern 240 to enhance the thermal dissipation of the first metal pattern 240 and recover the polishing damage of the interlayer dielectric layer 210.

Figure 4:
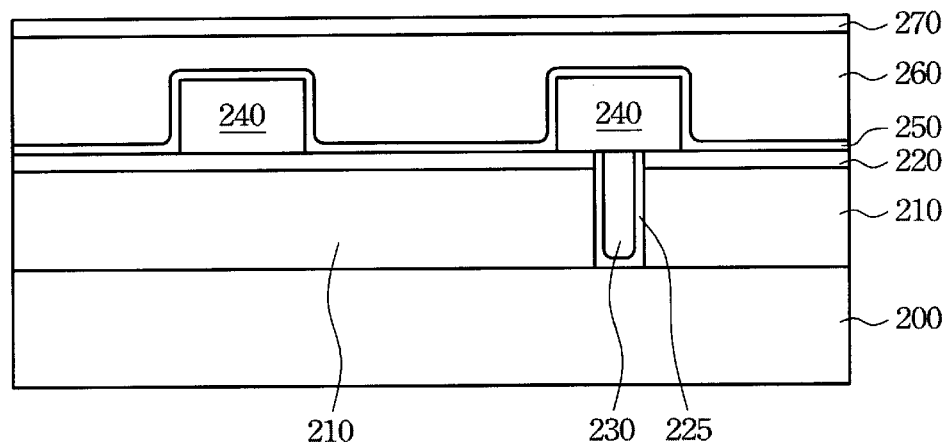
FIG. 4 shows a cross-section view of a substrate in accordance with the present invention, a first intermetal dielectric layer covers on the first metal pattern and a cap layer covers on the first intermetal dielectric layer.
Figure 5:
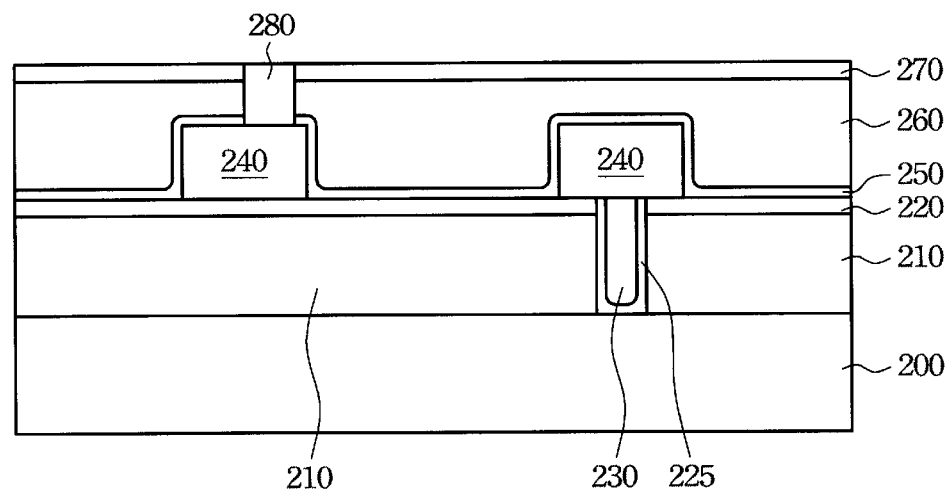
FIG. 5 shows a cross-section view of a substrate in accordance with the present invention, a silicon nitride plug is defined in the first intermetal dielectric layer to contact to the first metal pattern.

Referring to FIG. 4, a liner oxide layer 250 is deposited on the first metal pattern 240 and on the silicon nitride layer 220 by using chemical-vapor-deposition (CVD) process. An intermetal dielectric layer 260 is deposited on the liner oxide layer 250 for the insulating of metal interconnection lines and a cap layer 270 is formed on the intermetal dielectric layer 260. Referring to FIG. 5, an etching process and a lithography process are performed to etch the cap layer 270, the intermetal dielectric layer 260 and the liner oxide layer 250. After the etching process, a contact hole is formed in the liner oxide layer 250, the cap layer 270 and the intermetal dielectric layer 260 to expose the surface of the first metal pattern 240. A silicon nitride plug 280 is formed in the contact hole above the first metal pattern 240 and it connects with the first metal pattern 240, as shown in FIG. 5.

Figure 6:
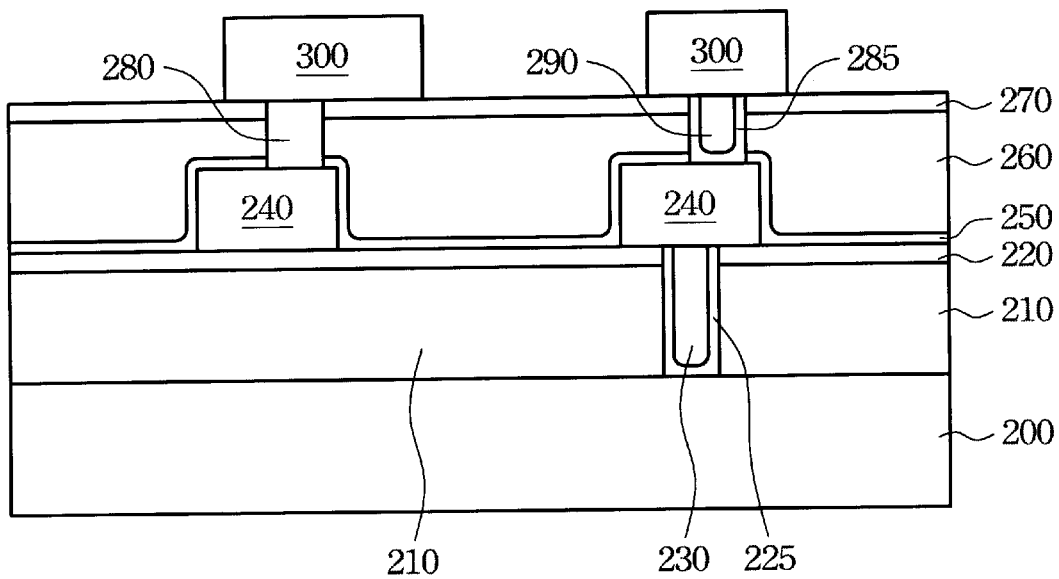
FIG. 6 shows a cross-section view of a substrate in accordance with the present invention, a tungsten plug is defined in the first intermetal dielectric layer to contact to the first metal pattern and a second metal pattern is defined on the first intermetal dielectric layer to communicate with the first metal pattern by using the tungsten plug.

Referring to FIG. 6, the liner oxide layer 250, the intermetal dielectric layer 260 and the cap layer 270 are etched to form a contact hole above the first metal pattern 240. A barrier layer 285 is defined on the sidewall and the bottom of the contact hole above the first metal pattern 240 and a metal plug 290 is then defined on the barrier layer 285.

Referring to FIG. 6, a second metal pattern 300 is defined on the cap layer 270, the silicon nitride plug 280 and the metal plug 290. The second metal pattern 300 electrically connects to the first metal pattern 240 by using the metal plug 290 and the thermal conduction between the second metal pattern 300 and the first metal pattern 240 is implemented by the silicon nitride plug 280. Since silicon nitride material, such as the silicon nitride plug, has twice-larger thermal conductivity than silicon oxide material, such as the intermetal dielectric layer or the interlayer dielectric layer of integrated circuits, the silicon nitride plug 280 can increase the thermal dissipation efficiency between the metal patterns in integrated circuits.

Referring to FIG. 7, a third metal pattern 360 is formed over the second metal pattern 300 and an intermetal dielectric layer 320 is formed between the third metal pattern 360 and the second metal pattern 300 for insulating. A liner oxide layer 310 is formed on the second metal pattern 300 and a cap layer 330 is formed between the third metal pattern 360 and the intermetal dielectric layer 320. The second metal pattern 300 and the third metal pattern 360 are connected by a silicon nitride plug 340 and a metal plug 350. Moreover, a barrier layer 345 is formed between the metal plug 350 and the intermetal dielectric layer 320 for adhesion of these two thin film layers. The silicon nitride plug 340 serves as a thermal conductor and the metal plug 350 is used for the electrical coupling between the second metal pattern 300 and the third metal pattern 360.

In general, the intermetal dielectric layers of high-speed integrated circuits are formed of low dielectric-constant organic material. Consequently, these layers have a poor thermal conductivity. In the present invention, the silicon nitride plugs in intermetal dielectric layers of integrated circuits can improve the thermal conductivity of metal interconnection lines of integrated circuits and the silicon nitride layer underneath the first metal pattern of integrated circuits is a good thermal conductor for the integrated circuits.

While the preferred embodiment of the invention has been illustrated and described, it will be appreciated that various changes can be made therein without departing from the spirit and scope of the invention.

What is claimed is:

1. A structure of metal interconnection lines in integrated circuits for improving thermal conductivity of said metal interconnection lines, comprising:
   a substrate, wherein said integrated circuits formed on said substrate;
   an interlayer dielectric layer formed on said substrate;
   a silicon nitride layer formed on said interlayer dielectric layer;
   at least one first metal plug formed in said interlayer dielectric layer and said silicon nitride layer;
   a first metal pattern formed on said silicon nitride layer and communicated with said integrated circuits by said at least one first metal plug;
   a liner oxide layer formed on said first metal pattern and on said silicon nitride layer;
   an intermetal dielectric layer formed on said liner oxide layer;
   at least one second metal plug formed in said intermetal dielectric layer and said liner oxide layer;
   at least one silicon nitride plug formed in said intermetal dielectric layer and said liner oxide layer; and
   a second metal pattern formed on said intermetal dielectric layer, said at least one silicon nitride plug and said at least one second metal plug, said second metal pattern communicated with said first metal pattern by said at least one second metal plug, wherein said at least one silicon nitride plug being adapted for improving thermal conductivity.

2. The structure according to claim 1, further comprises a barrier layer is formed between said at least one first metal plug and said interlayer dielectric layer, between said at least one first metal plug and said silicon nitride layer and, between said at least one first metal plug and said substrate.

3. The structure according to claim 1, further comprises a barrier layer is formed between said at least one second metal plug and said intermetal dielectric layer, between at least one second metal plug and said liner oxide layer, and between said at least one second metal plug and said first metal pattern.

4. The structure according to claim 1, wherein said at least one silicon nitride plug conducts heat between said second metal pattern and said first metal pattern.

5. The structure according to claim 1, wherein said silicon nitride layer is adapted for improving thermal conductivity of said first metal pattern.

6. The structure according to claim 1, wherein said at least one first metal plug and said at least one second metal plug are formed of metal tungsten.

7. A structure of metal interconnection lines in integrated circuits for improving thermal conductivity of said metal interconnection lines, comprising:
   a substrate, wherein said integrated circuits formed on said substrate;
   a plurality of metal patterns formed on said substrate for interconnection lines of said integrated circuits, wherein said metal patterns isolated from each other and from said substrate by dielectric layers for insulating;
   at least one metal plug formed in one of said dielectric layers between one of said metal patterns and other of said metal patterns formed thereon, wherein said plurality of metal patterns communicating to each other and to said integrated circuits on said substrate by said at least one metal plug therebetween; and
   at least one silicon nitride plug formed between one of said metal patterns and other of said metal patterns formed thereon, wherein said at least one silicon nitride plug adapted for improving thermal conductivity of said plurality of metal patterns.

8. The structure according to claim 7, further comprises a silicon nitride layer covered on said dielectric layer on said substrate for improving thermal conductivity of a first metal pattern on said substrate of said plurality of metal patterns.

9. The structure according to claim 7, further comprises a barrier layer formed between said dielectric layers and said at least one metal plug.

10. The structure according to claim 7, further comprises a liner oxide layer covered on each one of said plurality of metal patterns.

* * * * *